United States Patent
Lee et al.

(10) Patent No.: US 9,640,563 B2
(45) Date of Patent: May 2, 2017

(54) THIN FILM TRANSISTOR SUBSTRATE AND DISPLAY

(71) Applicant: InnoLux Corporation, Miao-Li County (TW)

(72) Inventors: Kuan-Feng Lee, Miao-Li County (TW); Tzu-Min Yan, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/880,472

(22) Filed: Oct. 12, 2015

(65) Prior Publication Data

US 2016/0111453 A1   Apr. 21, 2016

(30) Foreign Application Priority Data

Oct. 15, 2014  (TW) .............................. 103135621 A (51) Int. Cl.
*H01L 27/12*   (2006.01)

(52) U.S. Cl.
CPC ........ *H01L 27/1248* (2013.01); *H01L 27/124* (2013.01); *H01L 27/1225* (2013.01)

(58) Field of Classification Search
CPC  H01L 27/1248; H01L 27/1225; H01L 27/124
See application file for complete search history.

(56) References Cited

U.S. PATENT DOCUMENTS

| | | | |
|---|---|---|---|
| 2015/0034932 A1* | 2/2015 | Choi .................. | H01L 27/3258 257/40 |
| 2015/0102317 A1* | 4/2015 | Kim .................... | H01L 29/7869 257/40 |
| 2015/0295091 A1* | 10/2015 | Cao ...................... | G02F 1/1368 257/43 |

* cited by examiner

*Primary Examiner* — Douglas Menz
(74) *Attorney, Agent, or Firm* — McClure, Qualey & Rodack, LLP (57) ABSTRACT

Disclosed is a TFT substrate, including a substrate and a gate electrode thereon. A gate insulation layer over the substrate covers the gate electrode. An active layer is disposed over the gate insulation layer. An etch stop layer is disposed over the active layer and the gate insulation layer. A first opening penetrates the etch stop layer to expose a first part of the active layer. A source electrode over the etch stop layer is electrically connected to the first part of the active layer through the first opening. A first inorganic insulation layer is disposed over the source electrode and the etch stop layer. A second opening penetrates the first inorganic insulation layer and the etch stop layer to expose a second part of the active layer.

20 Claims, 5 Drawing Sheets

THIN FILM TRANSISTOR SUBSTRATE AND DISPLAY

CROSS REFERENCE TO RELATED APPLICATIONS

This Application claims priority of Taiwan Patent Application No. 103135621, filed on Oct. 15, 2014, the entirety of which is incorporated by reference herein.

BACKGROUND

Technical Field

The disclosure relates to a thin film transistor (TFT), and in particular relates to a TFT substrate and a display.

Description of the Related Art

The increasing progress of display technologies brings about great conveniences in people's daily lives. As such, flat panel displays (FPDs) have become popular as their being light and thin. In various FPDs, liquid crystal displays (LCDs) are popular among the consumers as their excellent properties, such as high space utilizing rate, being non-radiative, and exhibiting low electromagnetic interference.

LCDs are composed of a TFT substrate, a color filter (CF) substrate, and a liquid crystal layer disposed therebetween. The TFT substrate includes a plurality of thin film transistors in a plurality of pixels.

The development of LCDs is increasing their resolution. However, the distance between the source electrode and the drain electrode in the TFT cannot be reduced using conventional lithography technology with limited resolution. Therefore, the TFT size cannot be reduced. While pixel size has been reduced to increase resolution, the aperture ratio of the pixel is greatly decreased. Accordingly, method of reducing TFT size is now called for.

BRIEF SUMMARY

One embodiment of the disclosure provides a thin film transistor substrate, comprising: a substrate; a gate electrode disposed over the substrate; a gate insulation layer disposed over the substrate and covering the gate electrode; an active layer disposed over the gate insulation layer; an etch stop layer disposed over the active layer and the gate insulation layer; a first opening penetrating the etch stop layer to expose a first part of the active layer; a source electrode disposed over the etch stop layer and electrically connected to the first part through the first opening; a first inorganic insulation layer disposed over the source electrode and the etch stop layer; a second opening penetrating the first inorganic insulation layer and the etch stop layer to expose a second part of the active layer; a barrier layer disposed over a sidewall and a bottom of the second opening and contacting the second part; an organic insulation layer disposed over the first inorganic insulation layer; a third opening penetrating the organic insulation layer to expose the barrier layer; and a transparent electrode disposed over a part of the organic insulation layer and contacting the barrier layer through the third opening.

One embodiment of the disclosure provides a display, comprising: a thin film transistor substrate, comprising: a substrate; a gate electrode disposed over the substrate; a gate insulation layer disposed over the substrate and covering the gate electrode; an active layer disposed over the gate insulation layer; an etch stop layer disposed over the active layer and the gate insulation layer; a first opening penetrating the etch stop layer to expose a first part of the active layer; a source electrode disposed over the etch stop layer and electrically connected to the first part through the first opening; a first inorganic insulation layer disposed over the source electrode and the etch stop layer; a second opening penetrating the first inorganic insulation layer and the etch stop layer to expose a second part of the active layer; a barrier layer disposed over a sidewall and a bottom of the second opening and contacting the second part; an organic insulation layer disposed over the first inorganic insulation layer; a third opening penetrating the organic insulation layer to expose the barrier layer; and a transparent electrode disposed over a part of the organic insulation layer and contacting the barrier layer through the third opening; an opposite substrate; and a display medium disposed between the thin film transistor substrate and the opposite substrate.

One embodiment of the disclosure provides a thin film transistor substrate, comprising: a substrate; a gate electrode disposed over the substrate; a gate insulation layer disposed over the substrate and covering the gate electrode; an active layer disposed over the gate insulation layer; an etch stop layer disposed over the active layer and the gate insulation layer; a first opening penetrating the etch stop layer to expose a first part of the active layer; a source electrode disposed over the etch stop layer and electrically connected to the first part through the first opening; a first inorganic insulation layer disposed over the source electrode and the etch stop layer; a second opening penetrating the first inorganic insulation layer and the etch stop layer to expose a second part of the active layer; a barrier layer disposed over a sidewall and a bottom of the second opening and contacting the second part; a transparent electrode disposed over a part of the first inorganic insulation layer and contacting the barrier layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

It should be understood, that the following disclosure provides many different embodiments, or examples, for implementing different features. Specific examples of components and arrangements are described below to simplify the present disclosure. These are, of course, merely examples and are not intended to be limiting. Note that the present disclosure may repeat reference numbers and/or letters in the various examples. This repetition is for the purpose of simplicity and clarity and does not in itself dictate a relationship between the various embodiments and/or configurations discussed. Further, when a layer is referred to as being on another layer, it may be directly on the other layer, or intervening layers may also be present. In the drawings, the shape and thickness of one embodiment may be exaggerated for clarity and convenience. In addition, elements not specifically shown or described may take various forms well known to those skilled in the art.

Figure 1:
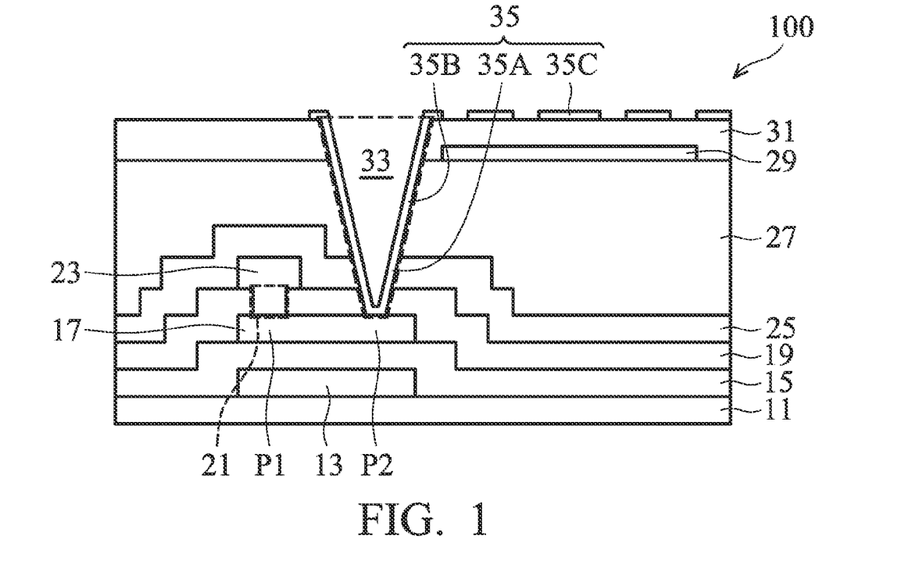
FIG. 1 shows a cross section of a TFT substrate in one embodiment of the disclosure.

FIG. 1 shows a cross-section of a TFT substrate 100 in one embodiment of the disclosure. The TFT substrate 100 and processes for manufacturing the same are described below. Note that the TFT substrate 100 can be manufactured by other processes and is not limited by the following processes. The substrate 11 of the TFT substrate 100 can be glass, plastic, or other general substrate material. The gate electrode 13 disposed over the substrate 11 can be formed as described below: a gate electrode material layer can first be deposited over a full surface of the substrate 11, and then patterned by lithography to form the gate electrode 13. In one embodiment, the gate electrode 13 can be a single-layer structure or a multi-layer structure of metal such as molybdenum, aluminum, copper, or titanium, or an alloy thereof. The gate electrode material layer can be formed by physical vapor deposition (PVD), sputtering, or the like. The lithography process may include following steps: coating a photoresist such as spin-on coating, soft-bake, photomask alignment, exposure, post exposure bake, development, rinsing, drying such as hard-bake, other suitable processes, or a combination thereof. In addition, the exposure step in the lithography can be replaced with other methods such as maskless lithography, electron beam writing, or ion beam writing. The following etching step can be dry etching, wet etching, or a combination thereof.

A gate insulation layer 15 is then formed over the substrate 11 to cover the gate electrode 13. The gate insulation layer 15 can be organosiloxane compound or inorganic material such as silicon nitride, silicon oxide, silicon oxynitride, silicon carbide, aluminum oxide, hafnium oxide, or a multi-layer structure thereof. The gate insulation layer 15 can be formed by chemical vapor deposition (CVD) such as plasma enhanced CVD (PECVD), low pressure CVD (LPCVD), sub-atmosphere CVD (SACVD), physical vapor deposition (PVD), or the like. In one embodiment, the gate insulation layer 15 can be formed by CVD.

The active layer material is then formed over the gate insulation layer 15, and then patterned by lithography to form an active layer 17 over the gate electrode 13. In one embodiment, the active layer 17 can be metal oxide semiconductor. The metal oxide semiconductor can be indium gallium zinc oxide (IGZO). The active layer material can be formed by CVD (e.g. PECVD, LPCVD, or SACVD), PVD, solution synthesis deposition, or the like.

Subsequently, the etch stop layer 19 is formed over the active layer 17 and the gate insulation layer 15, and patterned by lithography to form a first opening 21. The first opening 21 penetrates the etch stop layer 19 to expose a first part P1 of the active layer 17. The etch stop layer 19 can be organosiloxane compound or inorganic material such as silicon nitride, silicon oxide, silicon oxynitride, silicon carbide, aluminum oxide, hafnium oxide, or a multi-layer structure thereof. The etch stop layer 19 can be formed by CVD (e.g. PECVD, LPCVD, or SACVD), PVD, or the like. A metal layer is then formed over the above structure, and then patterned to form a source electrode 23 over the etch stop layer. The source electrode 23 is electrically connected to the first part P1 of the active layer 17 through the first opening 21. In one embodiment, the source electrode 23 can be a single-layer structure or a multi-layer structure of metal such as molybdenum, aluminum, copper, or titanium, or an alloy thereof.

A first inorganic insulation layer 25 is then formed over the source electrode 23 and the etch stop layer 19. The first inorganic insulation layer 25 can be silicon nitride, silicon oxide, silicon oxynitride, silicon carbide, aluminum oxide, titanium oxide, hafnium oxide, or a multi-layer structure thereof. The first inorganic insulation layer 25 can be formed by CVD such as PECVD or PVD.

An organic insulation layer 27 is then formed over the above structure, and a common electrode 29 is then formed over a top surface of the organic insulation layer 27. The common electrode 29 can be a transparent conductive metal oxide such as indium tin oxide (ITO), indium zinc oxide (IZO), aluminum zinc oxide (AZO), cadmium tin oxide (CTO), tin oxide ($SnO_2$), zinc oxide (ZnO), or the like. The common electrode 29 can be formed by the following steps: a transparent conductive metal oxide layer is deposited over the organic insulation layer 27, and then patterned by lithography to define the common electrode 29.

A second inorganic insulation layer 31 is then formed over the organic insulation layer 27. A second opening 33 can be defined by lithography to penetrate the second inorganic insulation layer 31, the organic insulation layer 27, the first inorganic insulation layer 25, and the etch stop layer 19, thereby exposing a second part P2 of the active layer 17. The second inorganic insulation layer 31 can be silicon nitride, silicon oxide, silicon oxynitride, silicon carbide, aluminum oxide, titanium oxide, hafnium oxide, or a multi-layer structure thereof. The second inorganic insulation layer 31 can be formed by CVD such as PECVD or PVD. In one embodiment, the second inorganic insulation layer 31 and the first inorganic insulation layer 25 can be made of the same material.

A transparent electrode material is then formed over the above structure, and then patterned by lithography to define a transparent electrode 35. The transparent electrode 35 is disposed over a sidewall and a bottom of the second opening 33, and over a part of the second inorganic insulation layer 31. The transparent electrode 35 disposed over the bottom of the second opening 33 may serve as a drain electrode 35A. The transparent electrode 35 disposed over the part of the second inorganic insulation layer 31 may serve as a pixel electrode 35C. The drain electrode 35A and the pixel electrode 35C are electrically connected by the transparent electrode 35B disposed over the sidewall of the second opening 33. The transparent electrode 35 can be transparent conductive metal oxide such as ITO, IZO, AZO, CTO, $SnO_2$, ZnO, or the like. In one embodiment, the transparent electrode 35 and the common electrode 29 can be made of made of the same material.

The TFT substrate 100 as shown in FIG. 1 is completed by the above processes. Although the above processes may largely reduce the width of the active layer 17, the step of defining the second opening 33 (e.g. lithography) may produce a lot of byproduct deposited over the bottom and the sidewall of the second opening 33. The byproduct may degrade the electrical properties of the transparent electrode 35 and the performance of the TFT substrate 100.

Figure 2:
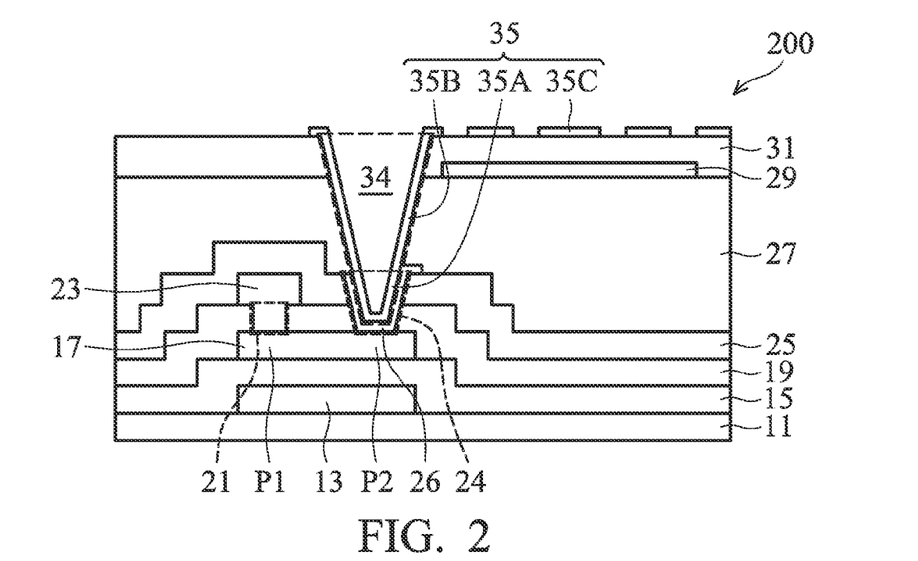
FIG. 2 shows a cross section of a TFT substrate in one embodiment of the disclosure.

For solving the byproduct problem, one embodiment of the disclosure provides a TFT substrate 200 as shown in FIG. 2. FIG. 2 (cross section) shows the TFT substrate 200, which corresponds to a cross section line I-I in FIG. 3 (top view). The TFT substrate 200 and processes for manufacturing the same are described below. Note that the TFT substrate 200 can be manufactured by other processes and is not limited by the following processes. The descriptions of materials and the processes for manufacturing the substrate 11, the gate electrode 13, the gate insulation layer 15, the active layer 17, the etch stop layer 19, the first opening 21, the source electrode 23, and the first inorganic insulation layer 25 of the TFT substrate 200 are omitted here because they are identical to those of the TFT substrate 100 in FIG. 1.

Figure 3:
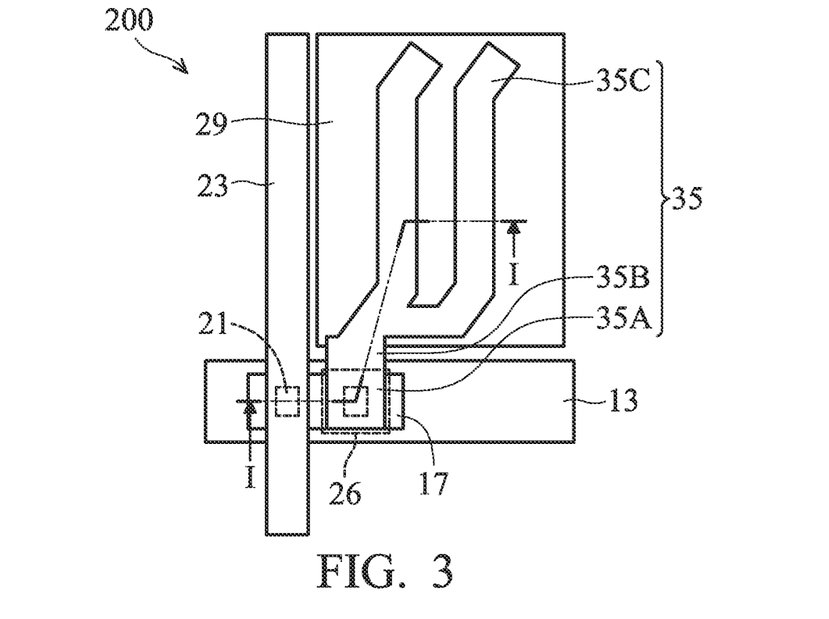
FIG. 3 shows a top view corresponding to the TFT substrate in FIG. 2.

After forming the first inorganic insulation layer 25, the first inorganic insulation layer 25 and the etch stop layer 19 are patterned by lithography to form a second opening 24, thereby exposing a second part P2 of the active layer 17. A barrier layer 26 is then formed over a sidewall and a bottom of the second opening 24 to contact the second part P2 of the active layer 17. In one embodiment, the barrier layer 26 may extend over a part of a top surface of the first inorganic insulation layer 25. The barrier layer 26 can be metal such as titanium or molybdenum, metal oxide semiconductor such as IGZO, or electrically conductive metal oxide such as ITO, IZO, AZO, CTO, SnO2, ZnO, or the like. No matter what material is selected for the barrier layer 26, the barrier layer 26 and the active layer 17 should have excellent electrical contact.

An organic insulation layer 27 is then formed over the above structure, and a common electrode 29 is then formed over a top surface of the organic insulation layer 27. The descriptions of materials and the processes for manufacturing the organic insulation layer 27 and the common electrode 29 are omitted here because they are identical to those in FIG. 1.

A second inorganic insulation layer 31 is then formed over the organic insulation layer 27 and the common electrode 29. A third opening 34 is then formed by lithography to penetrate the second inorganic insulation layer 31 and the organic insulation layer 27, thereby exposing the barrier layer 26. The descriptions of materials and the processes for manufacturing the second inorganic insulation layer 31 are omitted here because they are identical to those in the above description.

A transparent electrode material is then formed over the above structure, and then patterned by lithography to define a transparent electrode 35. The transparent electrode 35 is disposed over the barrier layer 26, a sidewall of the third opening 34, and a part of the second inorganic insulation layer 31. The transparent electrode 35 disposed over the barrier layer 26 may serve as a drain electrode 35A. The transparent electrode 35 disposed over the part of the second inorganic insulation layer 31 may serve as a pixel electrode 35C. The drain electrode 35A and the pixel electrode 35C are electrically connected by the transparent electrode 35B disposed over the sidewall of the third opening 34.

The TFT substrate 200 as shown in FIGS. 2-3 is completed by the above processes. The above processes not only reduce the width of the active layer 17, but also avoid byproduct deposited on the sidewall and the bottom of the third opening 34 during the step of defining the third opening 34. As such, both the electrical properties of the transparent electrode 35 and the performance of the TFT substrate 200 are improved.

Figure 4:
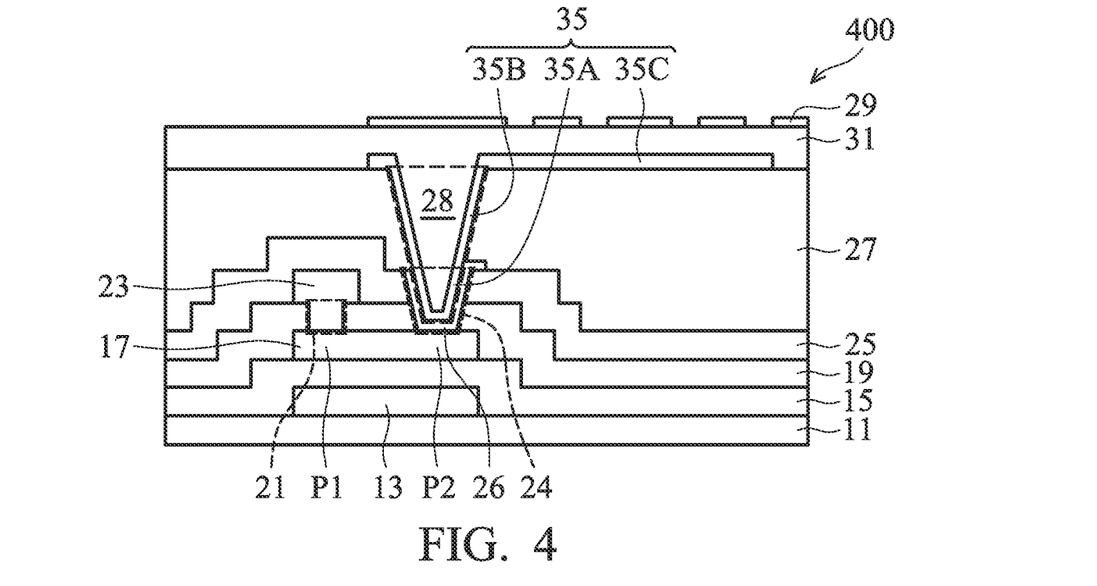
FIG. 4 shows a cross section of a TFT substrate in one embodiment of the disclosure.
Figure 5:
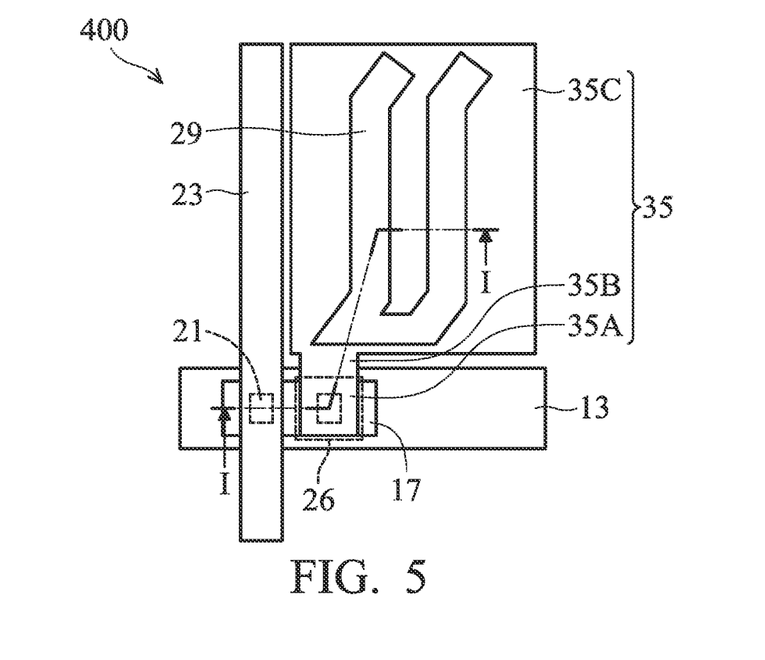
FIG. 5 shows a top view corresponding to the TFT substrate in FIG. 4.

In one embodiment, the TFT substrate 400 is shown in FIG. 4 (cross section), which corresponds to a cross section line I-I in FIG. 5 (top view). The TFT substrate 400 and processes for manufacturing the same are described below. Note that the TFT substrate 400 can be manufactured by other processes and is not limited by the following processes. The descriptions of materials and the processes for manufacturing the substrate 11, the gate electrode 13, the gate insulation layer 15, the active layer 17, the etch stop layer 19, the first opening 21, the source electrode 23, the first inorganic insulation layer 25, the second opening 24, and the barrier layer 26 of the TFT substrate 400 are omitted here because they are identical to those of the TFT substrate 200 in FIGS. 2-3.

An organic insulation layer 27 is then formed over the first inorganic insulation layer 25. The material of the organic insulation layer 27 is omitted here as it is identical to that in the above description. The organic insulation layer 27 is then patterned by lithography to form a third opening 28. The third opening 28 penetrates the organic insulation layer 27 to expose the barrier layer 26.

A transparent electrode material is then formed over the above structure, and then patterned by lithography to define a transparent electrode 35. The transparent electrode 35 is disposed over the barrier layer 26, a sidewall of the third opening 28, and a part of the organic insulation layer 27. The transparent electrode 35 disposed over the barrier layer 26 may serve as a drain electrode 35A. The transparent electrode 35 disposed over the part of the organic insulation layer 27 may serve as a pixel electrode 35C. The drain electrode 35A and the pixel electrode 35C are electrically connected by the transparent electrode 35B disposed over the sidewall of the third opening 28.

A second inorganic insulation layer 31 is then formed over the above structure, and a common electrode 29 is then formed over the second inorganic insulation layer 31. The descriptions of materials and the processes for manufacturing the second inorganic insulation layer 31 and the common electrode 29 are omitted here because they are identical to those in the above description.

The TFT substrate 400 as shown in FIGS. 4-5 is completed by the above processes. The above processes not only reduce the width of the active layer 17, but also avoid byproduct deposited over the sidewall and the bottom of the third opening 28 during the step of defining the third opening 28. As such, both the electrical properties of the transparent electrode 35 and the performance of the TFT substrate 400 are improved.

Figure 6:
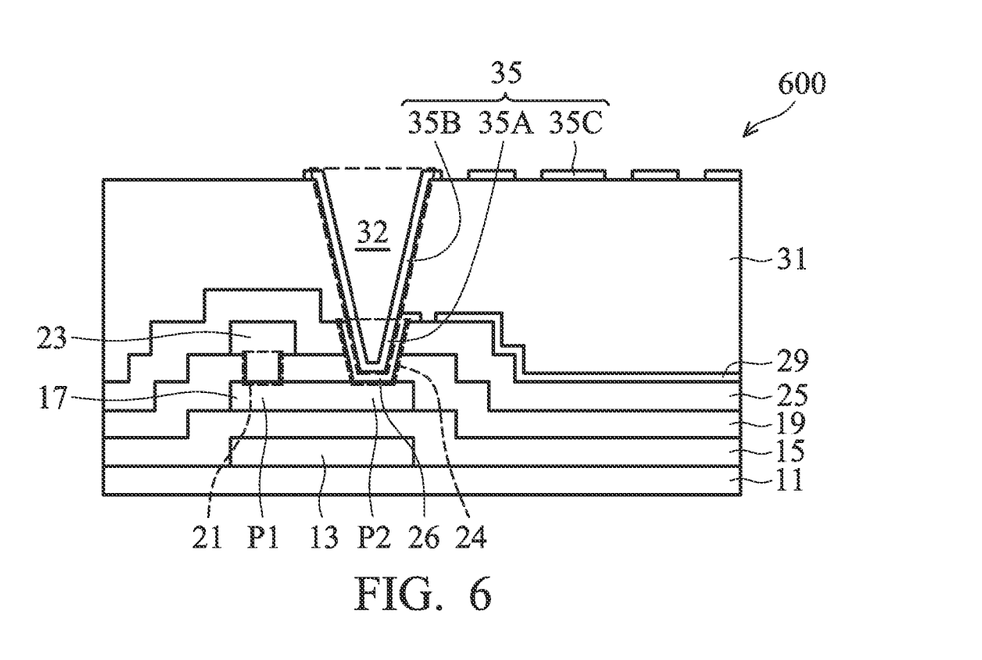
FIG. 6 shows a cross section of a TFT substrate in one embodiment of the disclosure.
Figure 7:
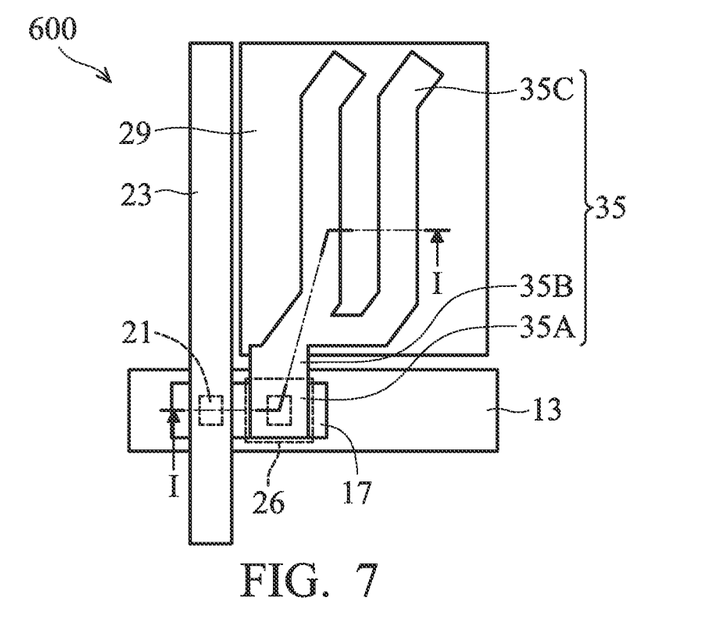
FIG. 7 shows a top view corresponding to the TFT substrate in FIG. 6.

In one embodiment, the TFT substrate 600 is shown in FIG. 6 (cross section), which corresponds to a cross section line I-I in FIG. 7 (top view). The TFT substrate 600 and processes for manufacturing the same are described below. Note that the TFT substrate 600 can be manufactured by other processes and is not limited by the following processes. The descriptions of materials and the processes for manufacturing the substrate 11, the gate electrode 13, the gate insulation layer 15, the active layer 17, the etch stop layer 19, the first opening 21, the source electrode 23, the first inorganic insulation layer 25, the second opening 24, and the barrier layer 26 of the TFT substrate 600 are omitted here because they are identical to those of the TFT substrate 200 in FIGS. 2-3.

A common electrode 29 is then formed over a part of the first inorganic insulation layer 25. The descriptions of materials and the processes for manufacturing the common electrode 29 are omitted here because they are identical to those in the above description. In one embodiment, the common electrode 29 and the barrier layer 26 are same material, such that the common electrode 29 and the barrier layer 26 can be simultaneously defined by the same processes.

A second inorganic insulation layer 31 is then formed over the first inorganic insulation layer 25. The descriptions of materials for the second inorganic insulation layer 31 are omitted here because they are identical to those in the above description. The second inorganic insulation layer 31 is then patterned by lithography to form a third opening 32. The third opening 32 penetrates the second inorganic insulation layer 31 to expose the barrier layer 26.

A transparent electrode material is then formed over the above structure, and then patterned by lithography to define a transparent electrode 35. The transparent electrode 35 is disposed over the barrier layer 26, a sidewall of the third opening 32, and a part of the second inorganic insulation layer 31. The transparent electrode 35 disposed over the barrier layer 26 may serve as a drain electrode 35A. The transparent electrode 35 disposed over the part of the second inorganic insulation layer 31 may serve as a pixel electrode 35C. The drain electrode 35A and the pixel electrode 35C are electrically connected by the transparent electrode 35B disposed over the sidewall of the third opening 32.

The TFT substrate 600 as shown in FIGS. 6-7 is completed by the above processes. The above processes not only reduce the width of the active layer 17, but also avoid byproduct deposited over the sidewall and the bottom of the third opening 32 during the step of defining the third opening 32. As such, both the electrical properties of the transparent electrode 35 and the performance of the TFT substrate 600 are improved.

Figure 8:
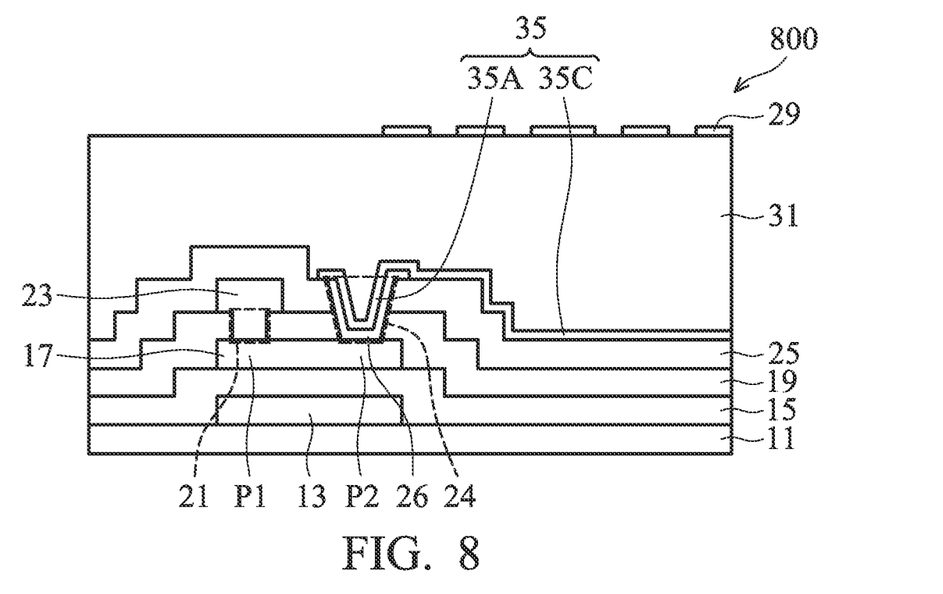
FIG. 8 shows a cross section of a TFT substrate in one embodiment of the disclosure.
Figure 9:
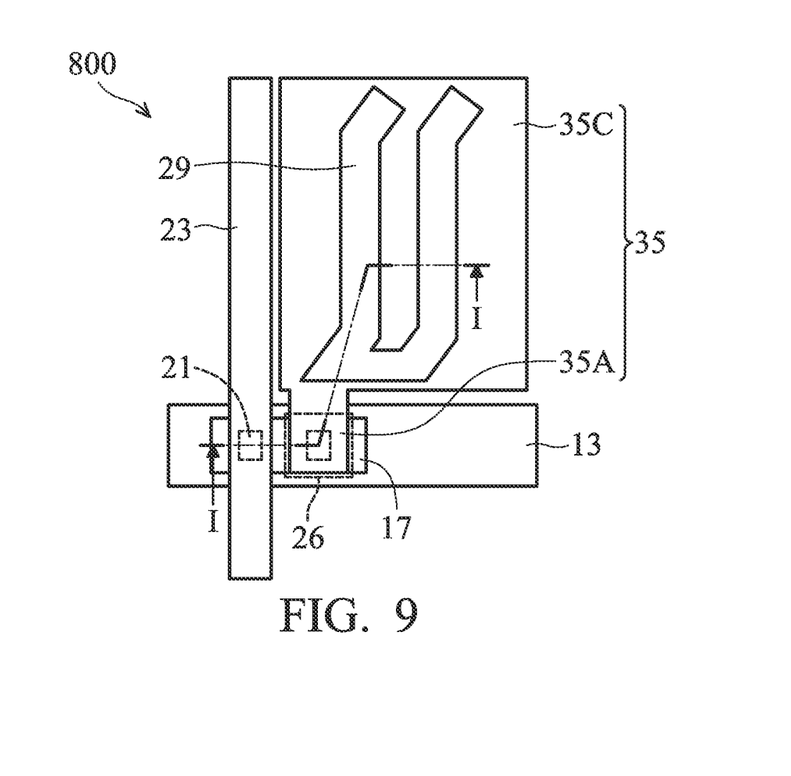
FIG. 9 shows a top view corresponding to the TFT substrate in FIG. 8.

In one embodiment, the TFT substrate 800 is shown in FIG. 8 (cross section), which corresponds to a cross section line I-I in FIG. 9 (top view). The TFT substrate 800 and processes for manufacturing the same are described below. Note that the TFT substrate 800 can be manufactured by other processes and is not limited by the following processes. The descriptions of materials and the processes for manufacturing the substrate 11, the gate electrode 13, the gate insulation layer 15, the active layer 17, the etch stop layer 19, the first opening 21, the source electrode 23, the first inorganic insulation layer 25, the second opening 24, and the barrier layer 26 of the TFT substrate 800 are omitted here because they are identical to those of the TFT substrate 200 in FIGS. 2-3.

A transparent electrode material is then formed over the barrier layer 26 and the first inorganic insulation layer 25, and then patterned by lithography to define a transparent electrode 35. The transparent electrode 35 is disposed over the barrier layer 26 and a part of the first inorganic insulation layer 25. The transparent electrode 35 disposed over the barrier layer 26 may serve as a drain electrode 35A. The transparent electrode 35 disposed over the part of the first inorganic insulation layer 25 may serve as a pixel electrode 35C. In one embodiment, the transparent electrode 35 and the barrier layer 26 are same material, such that the transparent electrode 35 and the barrier layer 26 can be simultaneously defined by the same processes.

A second inorganic insulation layer 31 is then formed over the above structure, and a common electrode 29 is then formed over the second inorganic insulation layer 31. The descriptions of materials and the processes for manufacturing the second inorganic insulation layer 31 and the common electrode 29 are omitted here because they are identical to those in the above description.

The TFT substrate 800 as shown in FIGS. 8-9 is completed by the above processes. The above processes not only reduce the width of the active layer 17, but also avoid byproduct deposited on the sidewall and the bottom of the second opening 24 during the step of defining the second opening 24. As such, both the electrical properties of the transparent electrode 35 and the performance of the TFT substrate 800 are improved.

Figure 10:
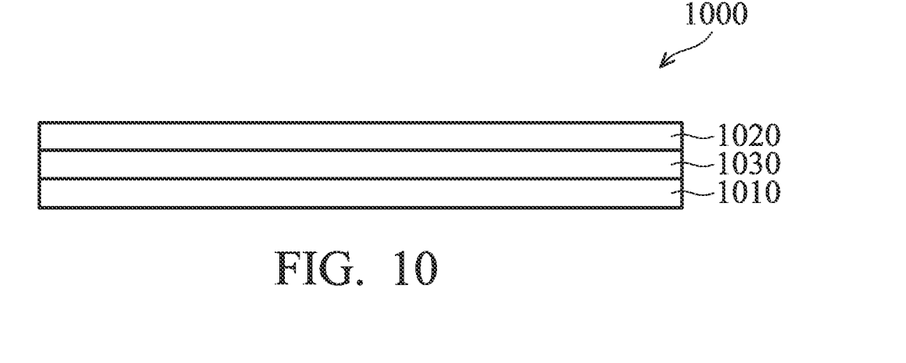
FIG. 10 shows a cross section of a display in one embodiment of the disclosure.

FIG. 10 shows a cross section of a display in one embodiment of the disclosure. In FIG. 10, the display 100 includes a TFT substrate 1010, an opposite substrate 1020, and a display medium 1030 between the TFT substrate 1010 and the opposite substrate 1020. The TFT substrate 1010 can be the TFT substrate 200, 400, 600, or 800. The display medium 1030 can be a liquid crystal layer or an organic light-emitting layer. The opposite layer 1020 can be a color filter substrate or a transparent substrate.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor substrate, comprising:
   a substrate;
   a gate electrode disposed over the substrate;
   a gate insulation layer disposed over the substrate and covering the gate electrode;
   an active layer disposed over the gate insulation layer;
   an etch stop layer disposed over the active layer and the gate insulation layer;
   a first opening penetrating the etch stop layer to expose a first part of the active layer;
   a source electrode disposed over the etch stop layer and electrically connected to the first part through the first opening;
   a first inorganic insulation layer disposed over the source electrode and the etch stop layer;
   a second opening penetrating the first inorganic insulation layer and the etch stop layer to expose a second part of the active layer;
   a barrier layer disposed over a sidewall and a bottom of the second opening and contacting the second part;
   an organic insulation layer disposed over the first inorganic insulation layer;
   a third opening penetrating the organic insulation layer to expose the barrier layer; and
   a transparent electrode disposed over a part of the organic insulation layer and contacting the barrier layer through the third opening.

2. The thin film transistor substrate as claimed in claim 1, wherein the transparent electrode over the barrier layer is a drain electrode, the transparent electrode over the part of the organic insulation layer is a pixel electrode, and the transparent electrode over a sidewall of the third opening electrically connects the drain electrode and the pixel electrode.

3. The thin film transistor substrate as claimed in claim 1, further comprising a second inorganic insulation layer over the organic insulation layer.

4. The thin film transistor substrate as claimed in claim 3, further comprising a common electrode over a part of the second inorganic insulation layer.

5. The thin film transistor substrate as claimed in claim 3, further comprising a common electrode disposed between the organic insulation layer and the second inorganic insulation layer, wherein the third opening further penetrates the second inorganic insulation layer, and the pixel electrode is disposed over a part of the second inorganic insulation layer.

6. The thin film transistor substrate as claimed in claim 1, wherein the barrier layer comprises metal, metal oxide semiconductor, or conductive metal oxide.

7. A display, comprising:
a thin film transistor substrate, comprising:
a substrate;
a gate electrode disposed over the substrate;
a gate insulation layer disposed over the substrate and covering the gate electrode;
an active layer disposed over the gate insulation layer;
an etch stop layer disposed over the active layer and the gate insulation layer;
a first opening penetrating the etch stop layer to expose a first part of the active layer;
a source electrode disposed over the etch stop layer and electrically connected to the first part through the first opening;
a first inorganic insulation layer disposed over the source electrode and the etch stop layer;
a second opening penetrating the first inorganic insulation layer and the etch stop layer to expose a second part of the active layer;
a barrier layer disposed over a sidewall and a bottom of the second opening and contacting the second part;
an organic insulation layer disposed over the first inorganic insulation layer;
a third opening penetrating the organic insulation layer to expose the barrier layer; and
a transparent electrode disposed over a part of the organic insulation layer and contacting the barrier layer through the third opening;
an opposite substrate; and
a display medium disposed between the thin film transistor substrate and the opposite substrate.

8. The display as claimed in claim 7, wherein the transparent electrode over the barrier layer is a drain electrode, the transparent electrode over the part of the organic insulation layer is a pixel electrode, and the transparent electrode over a sidewall of the third opening electrically connects the drain electrode and the pixel electrode.

9. The display as claimed in claim 7, further comprising a second inorganic insulation layer over the organic insulation layer.

10. The display as claimed in claim 9, further comprising a common electrode over a part of the second inorganic insulation layer.

11. The display as claimed in claim 9, further comprising a common electrode disposed between the organic insulation layer and the second inorganic insulation layer, wherein the third opening further penetrates the second inorganic insulation layer, and the pixel electrode is disposed over a part of the second inorganic insulation layer.

12. The display as claimed in claim 7, wherein the barrier layer comprises metal, metal oxide semiconductor, or conductive metal oxide.

13. A thin film transistor substrate, comprising:
a substrate;
a gate electrode disposed over the substrate;
a gate insulation layer disposed over the substrate and covering the gate electrode;
an active layer disposed over the gate insulation layer;
an etch stop layer disposed over the active layer and the gate insulation layer;
a first opening penetrating the etch stop layer to expose a first part of the active layer;
a source electrode disposed over the etch stop layer and electrically connected to the first part through the first opening;
a first inorganic insulation layer disposed over the source electrode and the etch stop layer;
a second opening penetrating the first inorganic insulation layer and the etch stop layer to expose a second part of the active layer;
a barrier layer disposed over a sidewall and a bottom of the second opening and contacting the second part;
a transparent electrode disposed over a part of the first inorganic insulation layer and contacting the barrier layer.

14. The thin film transistor substrate as claimed in claim 13, wherein the transparent electrode over the barrier layer is a drain electrode, and the transparent electrode over the part of the first inorganic insulation layer is a pixel electrode.

15. The thin film transistor substrate as claimed in claim 13, wherein the barrier layer comprises metal, metal oxide semiconductor, or conductive metal oxide.

16. The thin film transistor substrate as claimed in claim 13, further comprising a second inorganic insulation layer over the first inorganic insulation layer and the transparent electrode.

17. The thin film transistor substrate as claimed in claim 16, further comprising a common electrode over a part of the second inorganic insulation layer.

18. The thin film transistor substrate as claimed in claim 13, further comprising a second inorganic insulation layer between the first inorganic insulation layer and the transparent electrode.

19. The thin film transistor substrate as claimed in claim 18, further comprising a common electrode between the first inorganic insulation layer and the second inorganic insulation layer.

20. The thin film transistor substrate as claimed in claim 19, wherein the barrier layer and the transparent electrode are same material.

* * * * *